United States Patent
Adjeroud et al.

(10) Patent No.: US 11,124,871 B2
(45) Date of Patent: Sep. 21, 2021

(54) FLUIDIZED BED REACTOR ADAPTED FOR THE PRODUCTION OF BIPHASED SYSTEMS

(71) Applicant: Luxembourg Institute Of Science And Technology (LIST), Esch-sur-Alzette (LU)

(72) Inventors: Noureddine Adjeroud, Luxembourg (LU); Didier Arl, Metz (FR); Damien Lenoble, Wellin (BE); Mouhamadou Moustapha Sarr, Strasbourg (FR)

(73) Assignee: LUXEMBOURG INSTITUTE OF SCIENCE AND TECHNOLOGY (LIST), Luxembourg (LU)

( * ) Notice: Subject to any disclaimer, the term of this patent is extended or adjusted under 35 U.S.C. 154(b) by 64 days.

(21) Appl. No.: 16/064,067

(22) PCT Filed: Dec. 16, 2016

(86) PCT No.: PCT/EP2016/081599
§ 371 (c)(1),
(2) Date: Jun. 20, 2018

(87) PCT Pub. No.: WO2017/108636
PCT Pub. Date: Jun. 29, 2017

(65) Prior Publication Data
US 2019/0003045 A1    Jan. 3, 2019

(30) Foreign Application Priority Data
Dec. 21, 2015 (LU) .......................................... 92921

(51) Int. Cl.
*B01J 8/40* (2006.01)
*C23C 16/442* (2006.01)
(Continued)

(52) U.S. Cl.
CPC ............. *C23C 16/442* (2013.01); *B01J 8/006* (2013.01); *B01J 8/1836* (2013.01); *B01J 8/24* (2013.01);
(Continued)

(58) Field of Classification Search
CPC ... B01J 8/006; B01J 8/1836; B01J 8/24; B01J 8/40; B01J 19/0073; B01J 2219/2423;
(Continued)

(56) References Cited

U.S. PATENT DOCUMENTS 3,054,191 A * 9/1962 Hodgins .................. B01J 19/10
34/279
3,264,098 A * 8/1966 Heytmeijer ............... C22B 1/10
75/366

(Continued)

OTHER PUBLICATIONS

International Search Report for corresponding PCT/EP2016/081599 dated Mar. 30, 2017.
(Continued)

*Primary Examiner* — Lessanework Seifu
(74) *Attorney, Agent, or Firm* — Sandberg Phoenix & von Gontard, P.C.

(57) ABSTRACT

A fluidized bed reactor designed for in situ gas phase impregnation. The reactor comprises a tube with an upstream zone and a downstream zone, the upstream zone and the downstream zone being separated by a separation filter. A method for a controlled-deposition of a sublimated precursor onto a fluidized solid support. The method is remarkable in that it is carried out in situ within the tube of the fluidized bed reactor in accordance with the fluidized bed reactor.

18 Claims, 1 Drawing Sheet

(51) Int. Cl.
  *C23C 16/455* (2006.01)
  *C01B 32/16* (2017.01)
  *B01J 8/00* (2006.01)
  *B01J 8/18* (2006.01)
  *B01J 8/24* (2006.01)
  *B01J 19/00* (2006.01)
  *C23C 16/18* (2006.01)

(52) U.S. Cl.
  CPC ............ *B01J 8/40* (2013.01); *B01J 19/0073* (2013.01); *C01B 32/16* (2017.08); *C23C 16/18* (2013.01); *C23C 16/45555* (2013.01); *B01J 2208/00212* (2013.01); *B01J 2208/00752* (2013.01); *B01J 2219/2423* (2013.01); *B01J 2219/30408* (2013.01); *B01J 2219/30466* (2013.01)

(58) Field of Classification Search
  CPC . C23C 16/442; C23C 16/448; C23C 16/4481; C23C 16/4417; C23C 16/18
  See application file for complete search history.

(56) References Cited

U.S. PATENT DOCUMENTS

| | | | | |
|---|---|---|---|---|
| 3,442,690 A | * | 5/1969 | Peake | C23C 13/02 117/100 |
| 3,594,215 A | * | 7/1971 | Wakefield | C23C 14/22 427/213 |
| 5,057,296 A | * | 10/1991 | Beck | C01B 37/00 423/277 |
| 6,489,258 B1 | * | 12/2002 | Ying | B01J 29/0308 502/60 |
| 2003/0157000 A1 | * | 8/2003 | Janssen | H05H 1/2406 422/139 |
| 2004/0234445 A1 | | 11/2004 | Serp et al. | |
| 2008/0223851 A1 | * | 9/2008 | Biris | B01J 8/0015 219/634 |
| 2012/0091223 A1 | * | 4/2012 | Yi | C01F 17/206 239/102.1 |
| 2018/0221946 A1 | * | 8/2018 | Mazet | B22F 3/1055 |

OTHER PUBLICATIONS

King et al.: "Atomic layer deposition on particles using a fluidized bed reactor with in situ mass spectrometry". Surface & Coatings Technology 201 (2007) 9163-9171.

Kirkbir et al.: "Formation and Growth Mechanism of Porous, Amorphous, and Fine Particles Prepared by Chemical Vapor Deposition. Titania from Titanium Tetraisopropoxide". The Canadian Journal of Chemical Engineering vol. 65, Oct. 1987, 759-766.

Tiznado et al.: "Pulsed-bed atomic layer deposition setup for powder coating". Powder Technology 267 (2014) 201-207.

Popovska et al.: Catalytic growth of carbon nanotubes on zeolite supported iron, ruthenium and iron/ruthenium nanoparticles by chemical vapor deposition in a fluidized bed reactor. Powder Technology 207 (2011) 17-25.

* cited by examiner

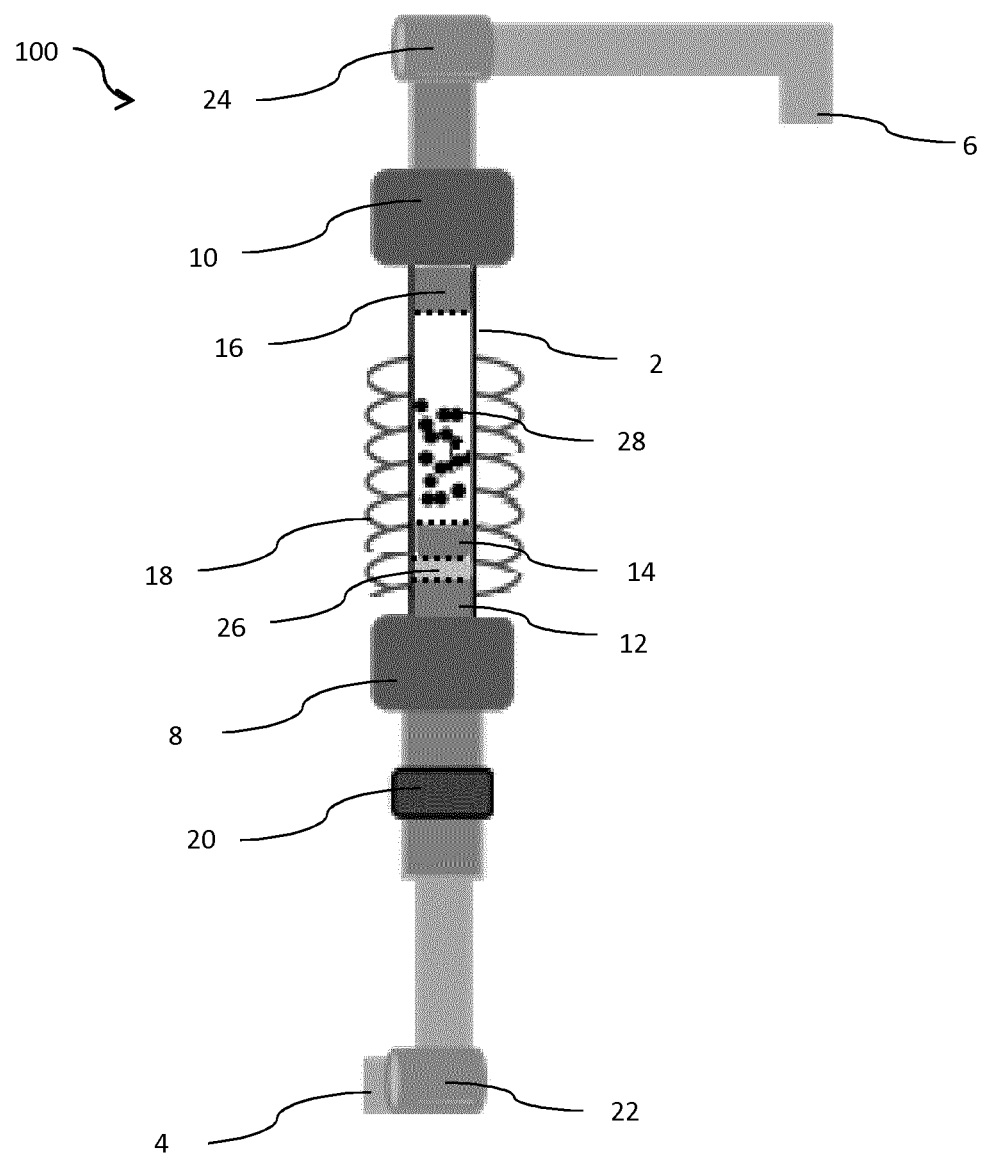

FLUIDIZED BED REACTOR ADAPTED FOR THE PRODUCTION OF BIPHASED SYSTEMS

CROSS-REFERENCE TO RELATED APPLICATIONS

The present invention is the US national stage under 35 U.S.C. § 371 of International Application No. PCT/EP2016/081599, which was filed on Dec. 16, 2016, and which claims the priority of application LU 92921 filed on Dec. 21, 2015, the content of which (text, drawings and claims) are incorporated here by reference in its entirety.

FIELD

The invention is directed to a fluidized bed reactor designed for performing in situ vapour phase impregnation on fluidized complex supports.

BACKGROUND

Gas phase reactions can be carried out in a fluidized bed reactor (FBR). A fluidized bed reactor is a type of reactor device that can be used to carry out a variety of multiphase chemical reactions. In this type of reactor, a fluid (gas or liquid) is passed through a solid substrate at high enough velocities to suspend the solid and cause it to behave as though it were a fluid (fluidization). Once the velocity increases, the contents of the reactor bed begin to expand and swirl around much like an agitated tank or boiling pot of water, allowing several types of chemical or physical reactions to take place.

Moreover, such known fluidized bed reactors comprise a stainless steel tube which is not adapted for ultra-low density powders. In that case, the fluidification regime cannot be tuned finely as it has been demonstrated for biphased system composed of a mesoporous core coated by CNTs. For example, if the mesoporous core comprises diatomite powder, which is very light, the fluidization process is very tricky and it is very difficult for the skilled person to adapt the fluidization parameters because of the powderiness of such diatomite powder. It is indeed known that particles which do not obey to Ergun's equation (see equation 1), are not easy to fluidize.

$$\frac{\Delta_P}{L_y} = 150 \frac{\mu_f}{d_P^2} \frac{\varepsilon^2}{(1-\varepsilon)^3} V_{SF} \quad \text{(eq. 1)}$$

wherein $\Delta_p$, $\mu f$, $V_{SF}$, $L_y$ and $\varepsilon$ respectively mean particles diameter, fluid viscosity, superficial fluid rate, height of medium and volume fraction of solid.

In order to consider the fluidization of such particles, the particles or the powder have been classified according to their mean diameter size, particles density and density of the gaseous mixture necessary to suspend those particles. Although the particles with a mean diameter size comprised between 100 μm and 600 μm and with a density comprised between 500 kg/m³ and 5000 kg/m³ are easy to fluidize, the particles with a mean diameter size comprised between 20 μm and 100 μm and with a density comprised between 250 kg/m³ and 500 kg/m³ are difficult to fluidize. The particles with a size higher than 700 μm are not adapted to a fluidization with gas. The particles with a mean diameter size under 20 μm, for example, diatomite particles which have a mean diameter size comprised between 1 μm and 10 μm are not easy to fluidize.

Many gas phase reactions can be performed in such Fluidized Bed Reactor such as Atomic Layer Deposition or Chemical Vapour Deposition (CVD).

Atomic layer deposition (ALD) is a chemical vapour deposition (CVD) technique suitable for manufacturing inorganic and organic material layers, with thickness down to a fraction of a monolayer. ALD has the capability to coat extremely complex shapes with a conformal material layer of high quality, a capability unique amongst thin film deposition techniques. Consequently, ALD-grown materials have a wide range of applications, from catalysts to electroluminescent displays to microelectronics and beyond.

The ALD process can be performed in wide range of temperatures starting from room temperature.

The studies of Soto et al. describe an ALD setup which is a pulsed-bed ALD (Soto et al., Powder Techno., 2014, 267, 201-207). This allows to coat powder-like materials successfully. Many types of powders can be handled with this particular setup, notably powders of different morphological characteristics, such as carbon nanotubes (CNTs), flower-like ZnO micro-arrays and YCrO3 particles. The resulting coatings are uniform, conformal, reproducible and exhibit thicknesses that can be controlled down to the nanoscale. However, although the system of Soto et al. allows the coating of CNTs by ALD, it does not allow the CNTs growth as such.

The studies of Zenneck et al. describe the preparation of carbon nanotubes by catalytic chemical vapour deposition with the help of iron, ruthenium and bimetallic Fe/Ru nanoparticles in a fluidized bed reactor. However, although the system of Zenneck et al. allows the production of multi-walled carbon nanotubes (MWCNTs), it does not allow the tuning between the production of single-walled carbon nanotubes (SWCNTs) and MWCNTs.

Whereas wet impregnation (WI) is widely used for wet 3D surface coating, Chemical Vapour Condensation (aerosol) (F. Kirkbir, H. Komiyama, Can. J. Chem. Eng., 1987, 65, 759) or CVD have been also used in gas phase approaches. Nevertheless, the concentration of the precursor and the residence time gave some limitations in terms of individual adjustments.

SUMMARY

The invention has for technical problem to provide a fluidized bed reactor (FBR) which overcomes all the above mentioned drawbacks of the FBR known in the art. More particularly, the fluidization of particles which do not obey Ergun's equation has not been processed smoothly and with efficiency, preventing therefore the faculty of such particles to be 100% functionalized by gas phase reactions such as atomic layer deposition or related. The fine control of nanoparticles size dispersion is also challenging with standard gas phase reactions due to (i) external transport of reactive gas to the FBR and (ii) turbulent fluid mechanic in the fluidization zone.

The first object of the invention is directed to a fluidized bed reactor comprising (a) a gas inlet and a gas outlet being located downstream from the gas inlet; (b) a tube inserted between the gas inlet and the gas outlet; and (c) a heating part connected to the tube. It is remarkable that the tube comprises an upstream zone and a downstream zone, the upstream zone and the downstream zone being separated by a separation filter. In other words, there is a splitting between the upstream zone and the downstream zone.

In various embodiments, the tube is made of material which is resistant to temperature of at least up to 1000° C. and in that the tube is transparent. The resistance to high temperature renders possible the sublimation of precursor powder such as organometallic precursor.

In various embodiments, that the tube is made of quartz.

In various embodiments, the upstream zone is delimited by the separation filter and by a first porous filter, and the downstream zone is delimited by the separation filter and by a second porous filter.

In various embodiments, the tube is inserted between the gas inlet and the gas outlet with respectively a first seal and a second seal. The seal allows the whole fluidized bed reactor to be vacuum-resistant.

In various embodiments, the first porous filter is adjacent to the first seal and in that the second porous filter is adjacent to the second seal.

In various embodiments, the heating part is a heating cable, a heating jacket and/or any thermal activation source.

In various embodiments, at least one vibrator is connected to the tube.

In various embodiments, the upstream zone of the tube is configured to be loaded of at least one precursor powder to be sublimated, in various instances at least one organometallic precursor.

In various embodiments, the downstream zone of the tube is configured to be loaded with solid support, in various instances a powder.

The second object of the invention is directed to a method for a controlled-deposition of particles, preferably metallic, onto a solid support, the method being carried out with a fluidized bed reactor and comprising the steps of (a) fluidization of at least one solid support; and (b) impregnation of the fluidized solid support of step (a) by a sublimated precursor powder. The method is remarkable in that it is carried out with a fluidized bed reactor in accordance with the first object of the present invention.

The particles of the precursor powder are advantageously nanoparticles.

In various embodiments, the sublimated precursor powder is formed by heating the precursor powder to be sublimated, the precursor powder be sublimated being present within the upstream zone of the tube of the fluidized bed reactor.

In various embodiments, the precursor powder to be sublimated is an organometallic precursor, in various instances comprising a metal derivative, the metal derivatives being one of titanium, vanadium, iron, chromium, ruthenium, cobalt, iridium, nickel, copper zinc or manganese.

In various embodiments, the precursor powder to be sublimated is an organometallic precursor, in various instances an organometallic precursor at least functionalized with an organic ligand, for example an acetylacetonate moiety.

In various embodiments, the method further comprises the step of removing the organic ligand, the step of removing the organic ligand being carried out by tuning the temperature. In particular, the organic ligand is a volatile moiety such as an acetylacetonate moiety.

In various embodiments, that solid support is a powder with a mean diameter size below 20 μm.

In various embodiments, the solid support is made of particles, in various instances a powder composed of at least inorganic, organic, polymeric or metallic particles, for example silicon oxide, aluminium oxide, diatomite particles or zeolites compounds.

In various embodiments, the step (a) is carried out with a flow of inert gas, the flow being preferably comprised between 50 sccm (standard cubic centimetres per minute) and 1000 sccm, in various instances of 75 sccm-500 sccm, for example of 100 sccm-300 sccm.

In various embodiments, step (b) is carried out at a temperature comprised between 150° C. and 190° C. under a flow of inert gas, the flow being comprised between 50 sccm and 1000 sccm, in various instances of 75 sccm-500 sccm, for example of 100 sccm-300 sccm.

The third object of the invention is directed to a method for chemically functionalizing a solid support, comprising the method in accordance with the second object of the present invention and the subsequent step of adding a mixture of reactive gas and inert gas into the fluidized bed reactor.

In various embodiments, the reactive gas is a vapour of a specific precursor used for atomic layer deposition process or at least one of acetylene, hydrogen or methane.

The invention is particularly interesting in that the splitting of (i) the adsorption of the reactive gas to the surface and (ii) the formation of nanoparticles gives more flexibility and control to chemical and physical processes occurring within the fluidized bed reactor. The fine control of each parameter (gas fluxes, temperature and time of reaction) allows to obtain a control on the impregnation and the fluidization of the powder precursor which at the end, allows the fine control of the morphology of the end product, e.g. a biphased product. For example, the fluidized bed reactor allows the in situ chemical vapor impregnation of fluidized porous particles by a "one pot" process. This fluidization in the fluidized bed reactor of the invention further allows these particular particles to be functionalized by atomic layer deposition, in particular with nanoparticles. Those nanoparticles can also serve as starting point to further processes, such as controlled growth of carbon nanotubes on mesoporous support.

DRAWINGS

FIG. 1 is a scheme of a fluidized bed reactor in accordance with various embodiments of the present invention.

DETAILED DESCRIPTION

FIG. 1 describes the fluidized bed reactor 100 of the present invention. This device comprises a tube 2 which is transparent and resistant to high temperature, up to 1000° C., preferentially up to 1500° C. or even more. The tube 2 is preferably made of quartz. The tube 2 is inserted between a gas inlet 4 and a gas outlet 6. The gas outlet 6 is located downstream from the gas inlet 4. The connection between the tube 2 and the gas inlet 4 is sealed by a first seal 8 whose the diameter is comprised between 50 mm and 60 mm. This diameter is sufficient to insert the tube 2 inside the first seal 8. The connection between the tube 2 and the gas outlet 6 is sealed by a second seal 10 whose the diameter is comprised between 50 mm and 60 mm. This diameter is sufficient to insert the tube 2 inside the second seal 10.

Furthermore, to be transparent and resistant to high temperature, the tube 2 is designed for being resistant to high vacuum and is electrically insulated.

The tube 2 is divided in two zones, an upstream zone and a downstream zone, the term upstream and downstream being defined according to the direction of the gas.

The upstream zone is adapted to comprise the solid precursor or the precursor powder to be sublimated 26, for example a metallic precursor or an organometallic precursor.

The downstream zone is adapted to comprise a solid support 28 made of particles or a powder onto which the precursor powder to be sublimated 26 must be impregnated.

The impregnation is only possible when the precursor powder to be sublimated 26 has been sublimated. This is possible by the fact that this precursor powder to be sublimated 26 is placed within the upstream zone of the tube 2 of the fluidized bed reactor, the upstream zone of the tube being connected to a heating part 18 of the fluidized bed reactor.

Both zones are physically separated by a separation filter 14 which is preferentially porous.

The tube 2 is further closed by a first porous filter 12 and a second porous filter 16. Those first and second porous filters are needed for containing the different materials present inside the tube 2. When the first porous filter 12 and second porous filter 16 are placed on the tube, they thus prevent the materials to exit the tube 2.

The separation filter 14, the first porous filter 12 and the second porous filter 16 are completely inserted within the tube.

The tube 2 is surrounded by a heating part 18, which is adapted to increase the temperature. The heating part 18 can be a heating cable, a heating jacket and/or any thermal activation source. The heating part 18 is further adjusted to the upstream zone which contains the powder precursor.

It is noted that the upstream zone and the downstream zone of the tube are both surrounded by the heating part 18.

The tube 2 has a cylindrical shape which is featured by a length comprised at least between 300 mm and 400 mm and by a diameter comprised at least between 25 mm and 30 mm. The thickness of the quartz layer is comprised at least between 2 mm and 4 mm.

A vibrator 20 can be positioned outside the tube 2, between the gas inlet 4 and the first porous filter 12. The vibrator 20 is adapted to enhance the fluidization of the particles.

A first valve 22 is positioned between the gas inlet 4 and the vibrator 20 and/or the first porous filter 12. The first valve 22 is useful for controlling the amount of gas and/or the rate of gas which is injected into the quartz tube 2.

A second valve 24 is positioned between the second porous filter 16 and the gas outlet 6. The gas outlet 6 is connected to a pumping system (not shown). The second valve 24 is useful for controlling the effects of the pumping system.

When functioning, the fluidized bed reactor comprises the precursor powder to be sublimated 26 in the upstream zone delimited by the first porous filter 12 and the separation filter 14. The precursor powder to be sublimated 26 is preferentially a metallic precursor. The metallic precursor is composed of a metallic derivative, preferentially functionalized with the ligand acetylacetonate. The metallic derivative is one of titanium, vanadium, iron, chromium, ruthenium, cobalt, iridium, nickel, copper, zinc or manganese.

The amount of the metal precursor 26 is comprised between 1 mg and 10 mg but can be adapted as a function of the reactor volume and/or the quantity of powder to be treated.

After sublimation of the precursor, preferably (organo)metallic, the sublimated powder is then condensed or impregnated on the fluidized solid support 28.

The system is closed and the pumping is applied to (i) check its tightness and (ii) to reach the base pressure of about 5 mbar-20 mbar.

A flow of 50 sccm-1000 sccm (standard cubic centimeters per minute) of neutral gas ($N_2$), preferentially of 100 sccm-300 sccm, is applied to ensure the fluidization of the solid support 28.

The choice of the neutral gas flow depends on the density of the fluidized powder.

The solid support 28 is a powder of very thin particles (<20 μm). Preferentially, silicon oxide, aluminium oxide, diatomite particles, zeolite can be employed.

Finally, the temperature is finely tuned to remove all the volatile impurities that may be produced in the course of the impregnation process. The temperature at which this step is carried out is known by the skilled person in the art as a function of the materials used in the process. For instance, the temperature is finely tune to release the volatile non-reactive part of the sublimated (organo)metallic precursor. The volatile non-reactive part is the ligand acetylacetonate.

An advantage of the fluidized bed reactor in accordance with the above description is that the impregnation of nanoparticles onto the solid support can be followed by further chemical reactions in situ without opening the inert atmosphere of the reaction media, i.e. without opening the inert atmosphere of the tube. The pressure of the inert gas can be varied and reactive gas can also be introduced. An example of reactive gas is hydrogen which can be used to reduce the metal precursor and forming therefore nanoparticles thin films deposited onto the powder. Another example of reactive gas is acetylene which can be used to grow carbon nanotubes when a catalyst, such as nanoparticles, is impregnated onto a surface. Those one-pot reactions allow a smooth growth of nanoparticles in a controlled fashion. The flux of gas can be precisely controlled as well as the temperature and the time of reaction.

EXAMPLE

Growth of carbon nanotubes (CNTs) on diatomite particles

Diatomite particles have a mean diameter size which is comprised between 1 μm and 10 μm. Up to 5 g of diatomite powder can be treated in one experiment. The particles are thus loaded into the downstream zone of the tube 2.

The fluidization efficiency is followed directly by a visual inspection through the tube 2 which is transparent. The vibrator 20 participates to the fluidization process.

The fluidization process is carried out under a neutral gas, preferentially a nitrogen gas flow.

The flow of neutral gas is stopped during the setting of temperature. The temperature is increased up to 150° C.-190° C. at a ramp of 2° C./min-10° C./min. As the temperature is reached, the impregnation process can start by applying a $N_2$ gas flow of 50 sccm-100 sccm (standard cubic centimeters per minute).

The process of impregnation is maintained during 1 min-30 min. At this stage, the metallic precursor 26 in the upstream zone is sublimated and the formed gas is condensed directly on the fluidized support composed of the fluidized diatomite powder 28. A homogeneous thin layer (i.e. one or two atomic layers) of metal is thus coated onto the diatomite particles.

The flow of $N_2$ gas is stopped and a ramp of temperature of 2° C./min-10° C./min is applied to reach a temperature comprised between 500° C. and 1000° C., which is necessary for CNTs growth. It is thus remarkable that this functionalization by carbon nanotubes can be achieved in situ inside the fluidized bed reactor according to the disclosure of the present invention. During this step, the metal catalyst nanoparticles are formed by a mechanism of surface migration due to the excess of thermal energy.

The tube 2 is very resistant and thanks to the first seal 8 and to the second seal 10, no leakage has been detected.

These elevated temperatures are perfectly supported by the tube 2, which when composed of quartz presents a melting point of 1670° C.

As the temperature is reached, a $H_2$ reduction is applied to reduce the oxide state of the metal nanocatalysts to pure metal nanoparticles. The reduction is obtained by applying a flow of $H_2$ diluted from 5% to 30% in $N_2$ during 5 min-30 min. Then $H_2$ flow is stopped.

After this step, the temperature is maintained constant and a flow of 20% $C_2H_2$ in $N_2$ is applied during 10 min-45 min, allowing thus the growth of the carbon nanotubes.

To end the process, a reduced $N_2$ flow of 30 sccm-50 sccm is applied during the cooling down to room temperature.

The in situ functionalization of diatomite powder by carbon nanotube has been achieved one pot, without letting air and dust to contact the diatomite powder.

Furthermore, the in situ functionalization by atomic layer deposition in the fluidized bed reactor of the present invention provides the formation of a perfect coating of the thin film composed of carbon nanotube onto the substrate (in this case diatomite particles).

Therefore, a biphased system (composed of a mesoporous core, i.e. diatomite particles, and of CNTs) has been produced thanks to the fluidized bed reactor and to the method of the present invention.

The invention claimed is:

1. A fluidized bed reactor, said fluidized bed reactor comprising:
    a gas inlet and a gas outlet being located downstream from the gas inlet;
    a tube made of quartz and inserted between the gas inlet and the gas outlet; and
    a heating part connected to the tube,
    wherein the tube comprises an upstream zone and a downstream zone, the upstream zone and the downstream zone being separated by a separation filter,
    wherein the tube is inserted inside a first seal in the gas inlet and inside a second seal in the gas outlet; and
    wherein at least one vibrator is connected to the tube, positioned outside the tube and distant from said tube, exclusively on a conduit between the gas inlet and the first seal.

2. The fluidized bed reactor according to claim 1, wherein the tube is made of material which is resistant to temperature of at least up to 1,000° C. and is transparent.

3. The fluidized bed reactor according to claim 1, wherein the upstream zone is delimited by the separation filter and by a first porous filter, and the downstream zone is delimited by the separation filter and by a second porous filter.

4. The fluidized bed reactor according to claim 3, wherein the first porous filter is adjacent to the first seal and the second porous filter is adjacent to the second seal.

5. The fluidized bed reactor according to claim 1, wherein the heating part is at least one of a heating cable, a heating jacket and a thermal activation source.

6. The fluidized bed reactor according to claim 1, wherein the upstream zone of the tube is configured to be loaded of at least one precursor powder to be sublimated.

7. The fluidized bed reactor according to claim 1, wherein the downstream zone of the tube is configured to be loaded with solid support.

8. The fluidized bed reactor according to claim 1,
    wherein the upstream zone forms a cavity to be loaded with at least one solid precursor in powder form and the downstream zone forms a cavity to be loaded with a solid support in powder form; and
    wherein the upstream zone is delimited by the separation filter and by a first porous filter, and the downstream zone is delimited by the separation filter and by a second porous filter, the second porous filter being structured and designed for containing inside the tube the solid support in powder form with particles of a size less than 20 µm.

9. The fluidized bed reactor according to claim 1, wherein the upstream zone is delimited by the separation filter and by a first porous filter, and the downstream zone is delimited by the separation filter and by a second porous filter.

10. The fluidized bed reactor according to claim 1, wherein the downstream zone of the tube is configured to be loaded with solid support.

11. A method for a controlled-deposition of particles onto a solid support, the method being carried out with a fluidized bed reactor and comprising the steps of:
    (a) fluidization of at least one solid support in powder form; and
    (b) impregnation of the fluidized solid support of step (a) by a sublimated precursor powder, wherein said fluidized bed reactor comprises:
    a gas inlet and a gas outlet being located downstream from the gas inlet;
    a tube made of quartz and inserted between the gas inlet and the gas outlet; and
    a heating part connected to the tube, wherein the tube comprises an upstream zone and a downstream zone, the upstream zone and the downstream zone being separated by a separation filter,
    wherein the tube is inserted inside a first seal in the gas inlet and inside a second seal in the gas outlet; and
    wherein at least one vibrator is connected to the tube, positioned outside the tube and distant from said tube, exclusively on a conduit between the gas inlet and the first seal.

12. The method according to claim 11, wherein the sublimated precursor powder is formed by heating a precursor powder to be sublimated.

13. The method according to claim 12, wherein the precursor powder to be sublimated is an organometallic precursor comprising a metal derivative, the metal derivative being one of titanium, vanadium, iron, chromium, ruthenium, cobalt, iridium, nickel, copper, zinc, or manganese.

14. The method according to claim 12, wherein the precursor powder to be sublimated is an organometallic precursor at least functionalized with an organic ligand.

15. The method according to claim 14, wherein the method further comprises the step of removing the organic ligand, the step of removing the organic ligand being carried out by tuning the temperature.

16. The method according to claim 11, wherein at least one of:
    the solid support is a powder with a mean diameter size below 20 µm, and the solid support is made of particles.

17. The method according to claim 11, wherein the step (a) is carried out with a flow of inert gas.

18. The method according to claim 11, wherein step (b) is carried out at a temperature comprised between 150° C. and 190° C. under a flow of inert gas, the flow being comprised between 50 sccm and 1,000 sccm.

\* \* \* \* \*